United States Patent
Gola et al.

[11] Patent Number: 5,808,477
[45] Date of Patent: Sep. 15, 1998

[54] CIRCUIT FOR DETECTION AND PROTECTION AGAINST SHORT CIRCUITS FOR DIGITAL OUTPUTS

[75] Inventors: Alberto Gola, Broni; Giona Fucili, Magenta; Marcello Leone, Milan; Patrizia Milazzo, Messina, all of Italy

[73] Assignees: SGS-Thomson Microelectronics S.r.l., Agrate Brianza; Consorzio per la Ricerca sulla Microelettronica nel Mezzogiorno, Catania, both of Italy

[21] Appl. No.: 657,878

[22] Filed: May 31, 1996

Related U.S. Application Data

[60] Provisional application No. 60/010,551, Jan. 25, 1996.

[30] Foreign Application Priority Data

May 31, 1995 [EP] European Pat. Off. ............. 95830230

[51] Int. Cl.$^6$ ..................... H03K 19/003; H03K 19/08
[52] U.S. Cl. ........................... 326/9; 326/26; 326/82; 361/93; 327/323
[58] Field of Search ..................... 326/9, 14, 82–83, 326/26–27, 63, 68, 81; 361/93, 98, 100; 327/310, 312, 316, 323

[56] References Cited

U.S. PATENT DOCUMENTS 4,342,065   7/1982   Larson .
4,875,000  10/1989   Fry et al. ................................. 318/798
4,884,165  11/1989   Kong et al. ............................... 361/98
5,256,914  10/1993   Boomer ..................................... 326/82

OTHER PUBLICATIONS

Patent Abstracts of Japan, vol. 18, No. 161 (E–1526) 17 Mar. 1994, and JP–A–05 335 926 (NEC Corp.) 17 Dec. 1993.

Patent Abstracts of Japan, vol. 8, No. 95, (E–242) (1532), 2 May 1984, and JP–A–59 012 625 (Nippon Denki K.K.).

*Primary Examiner*—Jon Santamauro
*Attorney, Agent, or Firm*—Groover and Associates, P.C.

[57] ABSTRACT

A sense and protection circuit against short circuits for digital outputs, comprising a logic gating circuit of the exclusive OR type (EX1) which has a first input terminal connected to a signal input node (IN) and an output terminal which is connected to an input terminal of a signal level shifter output stage (B). A second logic gating circuit of the exclusive OR type (EX2) has a first input terminal connected to the input node (IN) and a second input terminal connected, through an inverting circuit (IN1), to an output terminal (OUT) of the output stage (B). A second input terminal of the first logic gate circuit is coupled to an output terminal of the second logic gate circuit through a comparator circuit (SCH1) and a delay circuit means (C,R,D).

17 Claims, 2 Drawing Sheets

CIRCUIT FOR DETECTION AND PROTECTION AGAINST SHORT CIRCUITS FOR DIGITAL OUTPUTS

CROSS-REFERENCE TO RELATED APPLICATION

This application claims priority from EPC app'n 95830230.9, filed May 31, 1995, and U.S. Provisional application Ser. No. 60/010,551, filed Jan. 25, 1996, which is hereby incorporated by reference.

BACKGROUND AND SUMMARY OF THE INVENTION

This invention relates to sense and protection circuits for protecting integrated circuits against short circuits at their terminals, in particular to a sense and protection circuit for protection against short circuits at a logic signal output terminal.

As is known, signals of the logic type are associated with definite conditions of the potential at the output terminal, which potential generally can take but one of two distinct values.

Such values may either be that of the ground potential or the potential of a supply line to the integrated circuit, and normally correspond to a logic zero or a logic one.

Whereas several different types of protectors are used against short circuits either toward the supply or ground or the load for the output terminals of analog signals, the output terminals of logic signals are typically left unprotected against short circuits.

Usually, in fact, the typical supply conditions to integrated circuits having logic outputs are those of a low voltage, 3 or 5 V, and small current, a few mA, so that a shorted output terminal toward ground or the supply may be no cause of special concern.

But whenever such supply conditions are departed from, as is the case with such up-to-date applications as the output stages of driver circuits for printing members of high-quality ink jet printers, values of dissipated power may easily be reached which can endanger an integrated circuit.

It should be noted that the direct incorporation of protection circuitry to an output stage of the logic type is inadvisable because this could affect its characteristics, and especially its speed.

A protection mode for the outputs of even power analog stages, based on the use of an external feedback loop between the output terminal of the stage and an input circuit node which is connected to the signal input via a capacitor, has been known.

An application of this kind is described, for instance, on page 265 of the SGS-Thomson "Designers' Guide to Power Products" Application Manual (2d.ed. June 1992), which is hereby incorporated by reference in its entirety. That solution involves, however, the provision of a capacitor of relatively large capacitance and, therefore, generally non-integratable to the device.

The technical problem underlying this invention is to provide a sense and protection circuit against short circuits for a digital output stage, in particular a stage operative to shift the output level of input logic signals.

This problem is solved by a sense and protection circuit against short circuits as described below.

The features and advantages of a protection circuit according to the invention will be apparent from the following description of an embodiment thereof, given by way of non-limitative example with reference to the accompanying drawings.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 1:
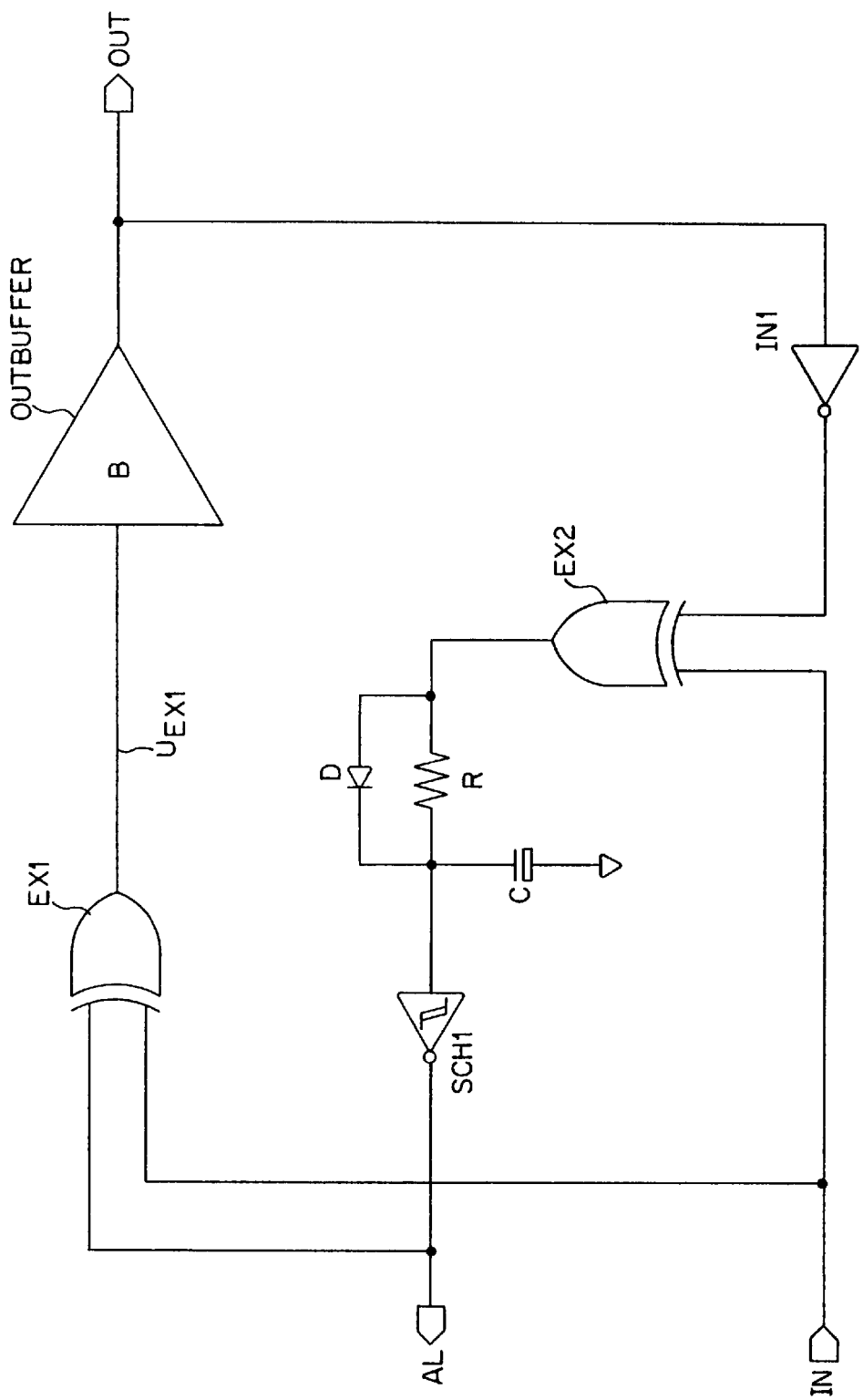
FIG. 1 is a diagram showing, partly in block form, a sense and protection circuit against short circuits according to the invention.

The numerous innovative teachings of the present application will be described with particular reference to the presently preferred embodiment (by way of example, and not of limitation), in which:

The circuit diagram shown in FIG. 1 includes an output stage B operative to shift the level of a logic signal.

Figure 2:
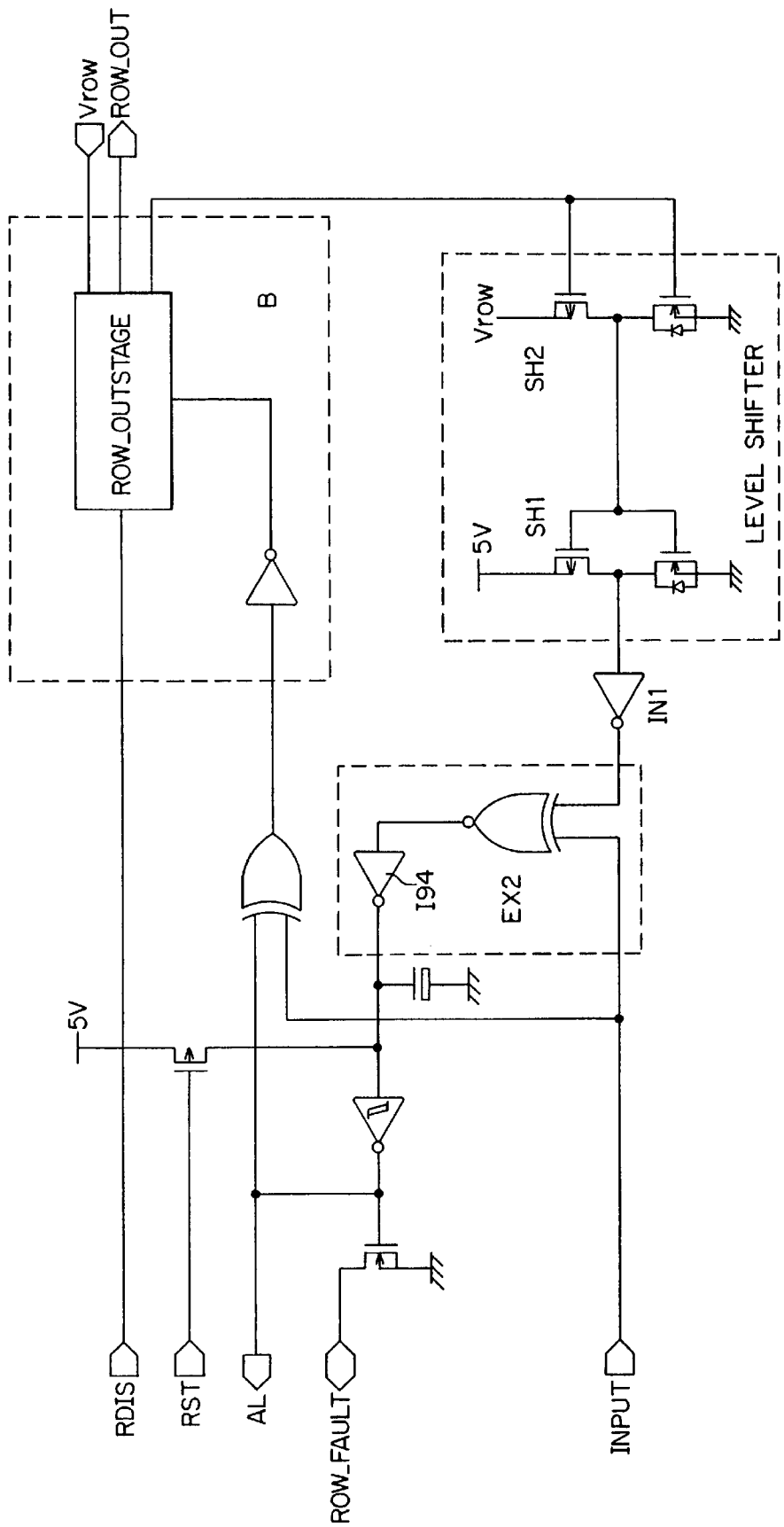
FIG. 2 shows a driver circuit for ink jet printing members which incorporates a protection circuit according to the invention.

This output stage operates, in the embodiment shown in FIG. 2 which concerns a driving arrangement for a printing head of a high-speed ink jet printer for computers, at output voltages which far exceed the typical value of 5 V, and has a sense and protection circuit according to this invention connected thereto.

This protection circuit consists of a first circuit comprised of a logic gate EX1 of the exclusive OR type and which has an input terminal connected to an input node IN for the signals to be shifted in level and an output terminal $U_{EX1}$ connected to an input terminal of the output stage B.

A second circuit, comprised of a logic gate EX2 also of the exclusive OR type, has a first input terminal connected to the input node IN and a second input terminal connected, through an inverting circuit IN1, to an output terminal OUT of the output stage.

A second input terminal of the circuit EX1 is connected to an output terminal of a threshold type of comparator circuit SCH1 which, as shown in the Figure, may have dual thresholds, of the Schmitt trigger type.

The circuit SCH1 has an input terminal coupled to an output terminal of the circuit EX2 through delay circuitry providing a predetermined delay and comprising, in this case, a capacitor C, a resistor R, and a diode D in parallel with the resistor.

The comparator output may be coupled to a fault-warning output terminal AL.

The inventive circuit originates from the need to have a short circuit at a logic output sensed in a simple manner for protection thereagainst.

A logic output stage may be schematically represented by a buffer or interface circuit, either of the inverting or non-inverting type.

The solution is completely separate from the circuitry of the output stage which can, accordingly, be qualified as a non-inverting buffer for the purpose of explaining the protector operation.

In a CMOS output structure comprising an upper and a lower transistor which are complementary to each other and driven by the same signals, when the output is at a logic high and a short circuit occurs toward ground, the dissipated power would be given by Vcc*ID, where ID is the current that the upper transistor can carry, and Vcc is the supply voltage.

When the output is in a logic low state, a short circuit to ground would be of no harm because the potential difference across the conducting transistor is zero, and therefore, the power dissipated by it is zero.

Exactly complementary is the instance where the short circuit is toward the power supply.

On the occurrence of a short circuit, it is desired that this condition be sensed circuit-wise and that the conduction conditions of the output stage be altered such that the potential difference across the active element (in a logic circuit, only one of the transistors would be on) be zero, thereby to implement a protective function.

In FIG. 1, the output buffer is denoted by the character B (in the embodiment shown, it is a non-inverting type, but the dual case, i.e. the inverting one, can easily be reduced to this situation) and receives the input signal on a logic gate of the exclusive OR type (EX1).

The output signal is picked up by an inverting circuit (IN1) and supplied to one of the two inputs of another exclusive OR (EX2).

The idea on which this invention stands is one of having the output logic level compared to the input level: the two levels should be coincident for, otherwise, the event is to be regarded as abnormal.

The logic signal output to EX2 is passed to a filter comprising a diode D, a resistor R, and a capacitor C. The output from this filter drives a Schmitt trigger circuit SCH1.

The signal being supplied to a terminal AL is both an indicator of an abnormal situation and an output control signal. On the occurrence of a short circuit, the XOR gate EX1 will invert the drive signal to the output stage, thereby cancelling the shorted condition.

Under "normal" conditions, the input of SCH1 would be high, and accordingly, the terminal AL would be in a low logic state and EX1 operating in the non-inverting mode, that is, with its output signal $U_{EX1}$ at the same logic level as its input.

The output buffer is only to transfer the signal to the device output.

With the input IN at a low logic level, AL also is at a low logic level, as is the buffer output.

At the inputs of EX2 there will be a low logic level and a high one; consequently, the output will be at a logic high, just as the input of SCH1, to confirm the logic zero on AL.

The components R, C and D form a unidirectional delay element in that the capacitor C is charged at a fast rate, at the power-on, and then discharged with a time constant RC. This network is directed to "mask off" the circuit for a longer time period than the propagation time of the output buffer.

In fact, assuming that the logic input IN moves from zero to one, the buffer output cannot switch to one at once. In this case, if this time interval were not masked, a false detection of a short circuit would occur.

The same signal appears at the inputs of EX2 throughout the period which corresponds to the delay of B; the output of EX2 goes to a low and begins to discharge the capacitor C through the resistor R.

By an appropriate selection of the time constant, the discharge can be terminated before the threshold of SCH1 is reached, and the capacitor is at once re-charged.

By converse, if the input IN (and consequently, the output OUT) is at a logic high, and a short circuit occurs toward ground, the output of B will be driven to ground and the current will take a value equal to that of the supply voltage divided by the output resistance of the p-channel transistor in the complementary transistor pair.

The output terminal of the inverting circuit IN1 goes over to a logic high, and EX2 output goes to zero, thereby beginning to discharge C through the resistor R.

If the short circuit is not removed, the discharge will continue until the threshold of SCH1 is reached, SCH1 output becoming high. Thus, EX1 will have both inputs at a "1" and respond by a logic low which propagates to the output OUT through B.

This output condition is a stable one, and will be retained even if the short circuit is removed.

Assuming that this occurs, nothing will change before the input IN goes from one over to zero; B will then have its input at a logic high, but the output OUT is held low for a corresponding time period to the propagation delay; during this time interval, EX2 has one input at a zero and the other at a one, and its output will go over to "1", thereby charging C at once and restoring to the original conditions. It therefore is necessary that the input changes its state back to the original conditions.

Similar considerations apply to the instance of a short circuit toward the supply.

The inverter IN1 has a threshold centered around a mid-value of the supply, and this is the value that should be attained in an over-loaded condition.

For example, if the two output transistors of the buffer have a resistance of 50 ohms, then the protector would trip on when the overload equals a load resistance of 50 ohms or less.

As an example, shown in FIG. 2 is an embodiment of the protection circuit according to the invention as implemented in a device from this applicant. The block B in phantom lines corresponds to the output buffer, EX2 being split into an exclusive NOR and an inverting circuit I94.

The inverting circuit I94 is asymmetrical, and thus performs the functions of R and D in FIG. 1: I94 can charge the capacitor at a fast rate, while the discharge current is quite small.

A transistor gives an external warning of an overload, while SH1 and SH2 have been included to provide a level shifting function, since the output circuit (ROW_OUTSTAGE) carries a potential in the neighborhood of 16 V.

Thus the innovative circuit advantageously provides overload sense and protection function, regardless of the output stage layout and without affecting its functional characteristics. It is simple and fast, so much so that its operation must be masked during the propagation times, and it is readily integratable together with the output stage.

According to a disclosed class of innovative embodiments, there is provided: an integrated circuit output stage, connected to a signal output line and a signal input line, comprising: an output stage, connected to drive said signal output line in accordance with a respective input; a comparison circuit operatively connected to compare the state of said signal output line with the state of said signal input line, and to provide a delayed and hysteretic comparison output accordingly; and a blocking stage which is interposed between said signal input line and said respective input of said output stage, connected to receive said comparison output and to change the state of said respective input of said output stage whenever said comparison output indicates that said input and output lines are remaining in non-corresponding states.

According to another disclosed class of innovative embodiments, there is provided: an integrated circuit output stage, connected to a signal output line and a signal input line, comprising: an output stage, connected to drive said signal output line in accordance with a respective input; a comparison circuit operatively connected to compare the state of said signal output line with the state of said signal input line, and to provide a comparison output accordingly; and a blocking stage which is interposed between said signal input line and said respective input of said output stage, connected to receive said comparison output and to change the state of said respective input of said output stage under at least some conditions when said comparison output indicates that said output line is shorted.

According to another disclosed class of innovative embodiments, there is provided: a method for protecting an integrated circuit output stage, comprising the steps of: operating the output stage to switch the state of an output signal when an external input signal switches state; monitoring said output signal to ascertain whether it properly corresponds to said external input signal; if said output signal does not properly correspond to said external input signal for at least a predetermined minimum duration, then forcing the output stage to switch the state of said output signal even though said external input signal has not switched state, and activating a fault-warning output.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

Modifications or substitutions may, of course, be made unto the embodiments described in ways familiar to the skilled persons in the art. For example, various other circuit configurations can be used to provide asymmetrical (or symmetrical) delay. Also, many other configurations can be used for hysteresis, e.g. using a flip-flop or a latch in combination with an edge detector. Other logic elements can be used in addition to (or instead of) the two XOR gates of FIG. 1, e.g. to implement POR conditions or selectable operation of the protection circuit.

In an alternative and less preferable class of embodiments, the invention can even be adapted to protect only against shorts to ground (using NAND or NOR gates instead of XORs). However, the preferred embodiment provides more extensive protection.

What is claimed is:

1. A protection circuit against short circuits for an output stage of an integrated circuit, comprising:
   a level shifter connected to receive an output signal from an output of the output stage, and generate a reduced voltage therefrom, the output stage having at least one input terminal and one output terminal, the input terminal of the output stage being coupled to an input node for the logic signals;
   first and second logic gate circuits of the exclusive OR type, each having at least first and second input terminals and an output terminal, the first input terminal and the output terminal of the first logic gate circuit being respectively coupled to the signal input node and the input terminal of the output stage, the first and second input terminals of the second logic gate circuit being respectively operatively coupled to the signal input node and to the output terminal of the output stage through the level shifter, the second input terminal of the first logic gate circuit being coupled to an output terminal of a threshold comparator circuit having an input terminal coupled to the output terminal of the second logic gate circuit through a circuit means providing a predetermined delay.

2. A protection circuit according to claim 1, characterized in that the comparator circuit is of the Schmitt trigger type.

3. A protection circuit according to claim 1, characterized in that the comparator circuit comprises an inverting circuit.

4. A protection circuit according to claim 1, characterized in that the circuit means providing a predetermined delay comprises a capacitor connected between the input terminal of the comparator circuit and a reference potential.

5. A protection circuit according to claim 4, characterized in that the circuit means providing a predetermined delay comprises a resistor and a diode connected in parallel with each other between the output terminal of the second logic gate circuit and the input terminal of the comparator circuit.

6. A protection circuit according to claim 4, characterized in that the circuit means providing a predetermined delay comprises an inverting circuit connected between the output terminal of the second logic gate circuit and the input terminal of the comparator circuit.

7. A protection circuit according to claim 1, for an output stage of the non-inverting type, wherein an inverting circuit is connected between the output terminal of the output stage and the second input terminal of the second logic gate circuit.

8. A protection circuit according to claim 1, wherein the output terminal of the comparator circuit is coupled to a short circuit warning terminal.

9. An ink jet printer for computers, characterized in that it comprises a driver circuit for printing members having a final stage which incorporates a protection circuit as claimed in claim 1.

10. An integrated circuit output stage, connected to a signal output line and a signal input line, comprising:
    an output stage, connected to drive said signal output line in accordance with a respective input;
    a comparison circuit operatively connected to compare the state of said signal output line with the state of said signal input line, and to provide a delayed and hysteretic comparison output accordingly; and
    a blocking stage which is interposed between said signal input line and said respective input of said output stage, connected to receive said comparison output and to change the state of said respective input of said output stage whenever said comparison output indicates that said input and output lines are remaining in non-corresponding states;
    wherein said blocking stage is supplied by a first supply voltage, and said output stage is supplied by a second supply voltage which is much larger than said first supply voltage.

11. An integrated circuit output stage, connected to a signal output line and a signal input line, comprising:
    an output stage, connected to drive said signal output line in accordance with a respective input;

a comparison circuit operatively connected to compare the state of said signal output line with the state of said signal input line, and to provide a delayed and hysteretic comparison output accordingly; and a blocking stage which is interposed between said signal input line and said respective input of said output stage, connected to receive said comparison output and to change the state of said respective input of said output stage whenever said comparison output indicates that said input and output lines are remaining in non-corresponding states;

wherein said blocking stage is an XOR gate.

12. An integrated circuit output stage, connected to a signal output line and a signal input line, comprising:

an output stage, connected to drive said signal output line in accordance with a respective input;

a comparison circuit operatively connected to compare the state of said signal output line with the state of said signal input line, and to provide a delayed and hysteretic comparison output accordingly; and a blocking stage which is interposed between said signal input line and said respective input of said output stage, connected to receive said comparison output and to change the state of said respective input of said output stage whenever said comparison output indicates that said input and output lines are remaining in non-corresponding states;

wherein said comparison circuit comprises an asymmetrical delay element and a hysteresis element.

13. An integrated circuit output stage, connected to a signal output line and a signal input line, comprising:

an output stage, connected to drive said signal output line in accordance with a respective input;

a comparison circuit operatively connected to compare the state of said signal output line with the state of said signal input line, and to provide a delayed and hysteretic comparison output accordingly; and a blocking stage which is interposed between said signal input line and said respective input of said output stage, connected to receive said comparison output and to change the state of said respective input of said output stage whenever said comparison output indicates that said input and output lines are remaining in non-corresponding states; and further comprising a level-shifter interposed between said output line and said comparison circuit.

14. An integrated circuit output stage, connected to a signal output line and a signal input line, comprising:

an output stage, connected to drive said signal output line in accordance with a respective input;

a comparison circuit operatively connected to compare the state of said signal output line with the state of said signal input line, and to provide a comparison output accordingly; and a blocking stage which is interposed between said signal input line and said respective input of said output stage, connected to receive said comparison output and to change the state of said respective input of said output stage under at least some conditions when said comparison output indicates that said output line is shorted;

wherein said blocking stage is supplied by a first supply voltage, and said output stage is supplied by a second supply voltage which is much larger than said first supply voltage.

15. An integrated circuit output stage, connected to a signal output line and a signal input line, comprising:

an output stage, connected to drive said signal output line in accordance with a respective input;

a comparison circuit operatively connected to compare the state of said signal output line with the state of said signal input line, and to provide a comparison output accordingly; and a blocking stage which is interposed between said signal input line and said respective input of said output stage, connected to receive said comparison output and to change the state of said respective input of said output stage under at least some conditions when said comparison output indicates that said output line is shorted;

wherein said blocking stage is an XOR gate.

16. An integrated circuit output stage, connected to a signal output line and a signal input lines comprising:

an output stage, connected to drive said signal output line in accordance with a respective input;

a comparison circuit operatively connected to compare the state of said signal output line with the state of said signal input line, and to provide a comparison output accordingly; and a blocking stage which is interposed between said signal input line and said respective input of said output stage, connected to receive said comparison output and to change the state of said respective input of said output stage under at least some conditions when said comparison output indicates that said output line is shorted;

wherein said comparison circuit comprises an asymmetrical delay element and a hysteresis element.

17. An integrated circuit output stage, connected to a signal output line and a signal input lines comprising:

an output stage, connected to drive said signal output line in accordance with a respective input;

a comparison circuit operatively connected to compare the state of said signal output line with the state of said signal input line, and to provide a comparison output accordingly; and a blocking stage which is interposed between said signal input line and said respective input of said output stage, connected to receive said comparison output and to change the state of said respective input of said output stage under at least some conditions when said comparison output indicates that said output line is shorted; and further comprising a level-shifter interposed between said output line and said comparison circuit.

* * * * *